United States Patent
Um

(10) Patent No.: US 9,990,875 B2
(45) Date of Patent: Jun. 5, 2018

(54) DISPLAY PANEL, METHOD AND DEVICE FOR MEASURING SCREEN FLICKERING, AND DISPLAY DEVICE

(71) Applicant: BOE TECHNOLOGY GROUP CO., LTD., Beijing (CN)

(72) Inventor: Yoonsung Um, Beijing (CN)

(73) Assignee: BOE TECHNOLOGY GROUP CO., LTD. (CN)

( * ) Notice: Subject to any disclaimer, the term of this patent is extended or adjusted under 35 U.S.C. 154(b) by 0 days. days.

(21) Appl. No.: 15/302,016

(22) PCT Filed: Sep. 18, 2015

(86) PCT No.: PCT/CN2015/089941
§ 371 (c)(1),
(2) Date: Oct. 5, 2016

(87) PCT Pub. No.: WO2016/179936
PCT Pub. Date: Nov. 17, 2016

(65) Prior Publication Data
US 2017/0186351 A1 Jun. 29, 2017

(30) Foreign Application Priority Data
May 11, 2015 (CN) .......................... 2015 1 0236707

(51) Int. Cl.
*G01R 31/26* (2014.01)
*G09G 3/00* (2006.01)
(Continued)

(52) U.S. Cl.
CPC ......... *G09G 3/006* (2013.01); *G01R 31/2825* (2013.01); *G02F 1/1368* (2013.01);
(Continued)

(58) Field of Classification Search
CPC .............. G01R 13/345; G01R 13/0272; G01R 31/3177
(Continued)

(56) References Cited

U.S. PATENT DOCUMENTS 6,011,502 A * 1/2000 Kao ...................... H03M 1/147
341/154
6,028,545 A * 2/2000 Chen ...................... H03M 1/144
341/156
(Continued)

FOREIGN PATENT DOCUMENTS

CN 101308297 A 11/2008
CN 203882061 U 10/2014
(Continued)

OTHER PUBLICATIONS

First Office Action for Chinese Application No. 201510236707.7, dated Apr. 24, 2017, 7 Pages.
(Continued)

Primary Examiner — Giovanni Astacio-Oquendo
(74) Attorney, Agent, or Firm — Brooks Kushman P.C.

(57) ABSTRACT

The present disclosure provides a display panel, a method and a device for measuring screen flickering, and a display device. The display panel includes a substrate, data lines and gate lines arranged on the substrate and crossing each other, and subpixel units defined by the data lines and the gate lines. Each subpixel unit includes a TFT, a pixel electrode, a first common electrode and a second common electrode. The second common electrode is connected to an input end capable of providing an alternating voltage at a first frequency. An orthogonal projection of the second common electrode onto the substrate at least partially overlaps an orthogonal projection of the pixel electrode onto the substrate.

15 Claims, 4 Drawing Sheets

(51) Int. Cl.
- *G02F 1/1368* (2006.01)
- *G02F 1/1335* (2006.01)
- *G02F 1/1362* (2006.01)
- *G02F 1/1343* (2006.01)
- *G01R 31/28* (2006.01)

(52) U.S. Cl.
CPC .. *G02F 1/133514* (2013.01); *G02F 1/134309* (2013.01); *G02F 1/136286* (2013.01); *G02F 2001/134318* (2013.01); *G02F 2201/123* (2013.01); *G09G 2320/0233* (2013.01); *G09G 2320/0247* (2013.01)

(58) Field of Classification Search
USPC .............. 324/76.24, 76.11, 76.12, 76.19
See application file for complete search history.

(56) References Cited

U.S. PATENT DOCUMENTS

| | | | | |
|---|---|---|---|---|
| 6,445,329 B1* | 9/2002 | Abassi | ............... | H03M 1/145 331/17 |
| 9,891,481 B2* | 2/2018 | Yang | ............... | G02F 1/134309 |
| 2013/0141659 A1* | 6/2013 | Xue | ............... | G02F 1/133555 349/43 |
| 2016/0357070 A1* | 12/2016 | Yang | ............... | G02F 1/1368 |

FOREIGN PATENT DOCUMENTS

| | | |
|---|---|---|
| CN | 104298032 A | 1/2015 |
| CN | 104834132 A | 8/2015 |
| JP | 2009223167 A | 10/2009 |
| JP | 5082960 B2 | 11/2012 |
| TW | 201013249 A | 4/2010 |
| WO | 2014041965 A1 | 3/2014 |

OTHER PUBLICATIONS

International Search Report and Written Opinion for Application No. PCT/CN2015/089941, dated Sep. 18, 2015, 13 Pages.

* cited by examiner

DISPLAY PANEL, METHOD AND DEVICE FOR MEASURING SCREEN FLICKERING, AND DISPLAY DEVICE

CROSS-REFERENCE TO RELATED APPLICATIONS

This application is the U.S. national phase of PCT Application No. PCT/CN2015/089941 filed on Sep. 18, 2015, which claims priority to Chinese Patent Application No. 201510236707.7 filed on May 11, 2015, the disclosures of which are incorporated in their entirety by reference herein.

TECHNICAL FIELD

The present disclosure relates to the field of liquid crystal display technology, in particular to a display panel, a method and a device for measuring screen flickering, and a display device.

BACKGROUND

Along with the rapid development of digital technology, digital display devices have been upgraded continuously, and more and more people are pursuing a better display effect of a liquid crystal display panel. Currently, a thin film transistor liquid crystal display (TFT-LCD) has gradually become a mainstream product due to its advantages such as small volume, low power consumption, being free of radiation and high resolution.

Usually, in the actual application, in the case that an image is displayed by the TFT-LCD, such a phenomenon as flickering may occur. Generally, in the case of a constant voltage, liquid crystal molecules may be maintained in a certain deflection direction all the time. In the case that the liquid crystal molecules are maintained in the same deflection direction for a long period of time, the TFT-LCD may be damaged. At this time, in the case that the voltage is changed, the liquid crystal molecules cannot be recovered to their initial states. Hence, in the actual application, an alternating voltage may be applied to the liquid crystal molecules, so as to enable the liquid crystal molecules to be deflected in different directions.

Referring to FIG. 1, data lines 11 and gate lines 12 are arranged on an array substrate in such a manner as to cross each other and define subpixel units. Each subpixel unit includes a TFT 13, a first common electrode 14, a pixel electrode 15 arranged between the first common electrode 14 and the TFT 13, and a capacitor 16 formed between the pixel electrode 15 and the first common electrode 14.

In the case that the TFT 13 is in an on state, a voltage across the data line 11 is applied to the pixel electrode 15, and meanwhile a constant voltage is applied to the first common electrode 14. In the case that the voltage applied to the pixel electrode is greater than the voltage applied to the first common electrode, the liquid crystal molecules may be deflected in a forward direction. In the case that the voltage applied to the pixel electrode is smaller than the voltage applied to the first common electrode, the liquid crystal molecules may be deflected in a backward direction. In the case that the liquid crystal molecules are deflected in the forward direction to a degree different from that in the backward direction, the "flickering" phenomenon may occur.

In the related art, usually the liquid crystal molecules are driven to deflect by alternating positive and negative voltages, and they are driven by the pixel electrode to deflect at a constant frequency. FIG. 2 shows a curve of a brightness value of the pixel electrode in the case that the liquid crystal molecules are driven by the pixel electrode to deflect at a low frequency, e.g., 60 Hz. As shown in FIG. 2, an amplitude of the brightness variation for the pixel electrode is relatively large. In addition, because the liquid crystal molecules are deflected at a low frequency, the brightness value of the pixel electrode may be varied at a low frequency too. Usually, in the case that the liquid crystal molecules are deflected at a frequency less than 120 Hz, the "flickering" phenomenon may easily be observed by human eyes, and in the case that the liquid crystal molecules are deflected at a frequency greater than or equal to 120 HZ, this phenomenon may not be easily observed by human eyes.

In a word, in the related art, the liquid crystal molecules are driven by the pixel electrode to deflect at a relatively low frequency, so a serious "flickering" phenomenon may occur for the display panel and may easily be observed by human eyes.

SUMMARY

An object of the present disclosure is to provide a display panel, a method and a device for measuring screen flickering, and a display device, so as to improve the screen flickering on a display panel without changing a deflection frequency of the liquid crystal molecules driven by a pixel electrode, thereby to prevent the screen flickering from being observed by human eyes easily.

In one aspect, the present disclosure provides in some embodiments a display panel, including a substrate, data lines and gate lines arranged on the substrate and crossing each other, and subpixel units defined by the data lines and the gate lines. Each subpixel unit includes a TFT, a pixel electrode, a first common electrode and a second common electrode. The second common electrode is connected to an input end capable of providing an alternating voltage at a first frequency. An orthogonal projection of the second common electrode onto the substrate at least partially overlaps an orthogonal projection of the pixel electrode onto the substrate.

According to the display panel in the embodiments of the present disclosure, the display panel includes the second common electrode, and the orthogonal projection of the second common electrode onto the substrate at least partially overlaps the orthogonal projection of the pixel electrode onto the substrate. A capacitor may be formed between the second common electrode and the pixel electrode. After the alternating voltage at a first frequency has been applied to the second common electrode, due to a charging or discharging process of the capacitor, the alternating voltage at the first frequency may be applied to the pixel electrode, so as to increase the frequency of the voltage applied to the pixel electrode, thereby to improve the screen flickering on the display panel and prevent the screen flickering from being observed easily by human eyes.

Optionally, each data line is connected to an input end capable of providing an alternating voltage at a second frequency smaller than the first frequency. Each data line is connected to the pixel electrode, and the voltage applied to the pixel electrode varies at the first frequency.

The data line is connected to the pixel electrode, so as to apply the alternating voltage at the second frequency to the pixel electrode. Meanwhile, the second common electrode is connected to the pixel electrode, so as to apply the alternating voltage at the first frequency greater than the second frequency to the pixel electrode, thereby to enable the frequency of the voltage applied to the pixel electrode to be identical to the first frequency, increase the frequency of the voltage applied to the pixel electrode and reduce a value of the voltage applied to the pixel electrode. As a result, it is able to improve the screen flickering on the display panel and prevent the screen flickering from being observed easily by human eyes.

Optionally, the pixel electrode, the first common electrode and the second common electrode are arranged on the array substrate, the first common electrode is arranged above the pixel electrode, and the second common electrode is arranged below the pixel electrode; or the second common electrode is arranged above the pixel electrode, and the first common electrode is arranged below the pixel electrode; or the second common electrode is arranged at a layer identical to the first common electrode.

Optionally, the pixel electrode and the second common electrode are both arranged on the array substrate, the first common electrode is arranged on a color filter substrate, and the second common electrode is arranged above or below the pixel electrode.

Optionally, the pixel electrode is arranged on the array substrate, the second common electrode and the first common electrode are both arranged on the color filter substrate, and the second common electrode is arranged above or below the first common electrode, or the second common electrode is arranged at a layer identical to the first common electrode.

Optionally, an orthogonal projection of the second common electrode onto a base substrate of the array substrate at least partially overlaps an orthogonal projection of the pixel electrode onto the base substrate of the array substrate, an orthogonal projection of the second common electrode onto the base substrate of the array substrate or a base substrate of the color filter substrate does not overlap an orthogonal projection of the first common electrode onto the base substrate of the array substrate or the color filter substrate, and the second common electrode is insulated from the first common electrode.

To be specific, in the case that the orthogonal projection of the second common electrode onto the base substrate of the array substrate at least partially overlaps the orthogonal projection of the pixel electrode onto the base substrate of the array substrate, it is able to form a capacitor between the second common electrode and the pixel electrode, and in the case that the orthogonal projection of the second common electrode onto the base substrate of the array substrate or the color filter substrate does not overlap the orthogonal projection of the first common electrode onto the base substrate of the array substrate or the color filter substrate and the second common electrode is insulated from the first common electrode, it is able to prevent the capacitor formed between the first common electrode and the second common electrode.

Optionally, the second common electrode is made of a transparent conductive layer or a conductive metal layer.

Optionally, the second common electrode is arranged within an orthogonal projection of a black matrix onto the color filter substrate or array substrate.

To be specific, in the case that the second common electrode is arranged within the orthogonal projection of the black matrix onto the color filter substrate or array substrate, it is able to prevent an aperture ratio of the display panel from being adversely affected.

In another aspect, the present disclosure provides in some embodiments a method for measuring screen flickering, including steps of: applying an alternating voltage at a first frequency to a second common electrode; determining a variation value of a voltage applied onto a pixel electrode in accordance with a variation value of the alternating voltage at the first frequency applied to the second common electrode; and determining a brightness variation value of the pixel electrode in accordance with the variation value of the voltage applied to the pixel electrode.

According to the method in the embodiments of the present disclosure, in the case that the alternating voltage at the first frequency is applied to the second common electrode, the voltage applied to the pixel electrode may be varied at the first frequency due to a capacitor formed between the second common electrode and the pixel electrode, so as to increase a variation frequency of the voltage applied to the pixel electrode. In addition, the variation value of the voltage applied to the pixel electrode may be reduced, so as to reduce the brightness variation value of the pixel electrode. As a result, it is able to improve the screen flickering on the display panel, thereby to prevent the flicking image from being observed easily by human eyes.

Optionally, the step of determining the variation value of the voltage applied to the pixel electrode in accordance with the variation value of the alternating voltage at the first frequency applied to the second common electrode includes determining the variation value of the voltage applied to the pixel electrode in accordance with the variation value of the alternating voltage at the first frequency applied to the second common electrode as well as a capacitance between a first common electrode and the pixel electrode and a capacitance between the second common electrode and the pixel electrode.

Optionally, the variation value of the voltage applied to the pixel electrode meets the following equation:

$$\Delta V_p = \frac{C2}{C1 + C2} \Delta V,$$

where $\Delta V_p$ represents the variation value of the voltage applied to the pixel electrode, C1 represents the capacitance between the first common electrode and the pixel electrode, C2 represents the capacitance between the second common electrode and the pixel electrode, and $\Delta V$ represents the variation value of the alternating voltage at the first frequency.

In yet another aspect, the present disclosure provides in some embodiments a device for measuring screen flickering, including: a voltage application unit configured to apply an alternating voltage at a first frequency to a second common electrode; a pixel electrode voltage variation determination unit configured to determine a variation value of a voltage applied onto a pixel electrode in accordance with a variation value of the alternating voltage at the first frequency applied to the second common electrode; and a pixel electrode brightness variation determination unit configured to determine a brightness variation value of the pixel electrode in accordance with the variation value of the voltage applied to the pixel electrode.

According to the device in the embodiments of the present disclosure, in the case that the alternating voltage at the first frequency is applied to the second common electrode, the voltage applied to the pixel electrode may be varied at the first frequency due to a capacitor formed between the second common electrode and the pixel electrode, so as to increase a variation frequency of the voltage applied to the pixel electrode. In addition, the variation value of the voltage applied to the pixel electrode may be reduced, so as to reduce the brightness variation value of the pixel electrode. As a result, it is able to improve the screen flickering on the display panel, thereby to prevent the flicking image from being observed easily by human eyes.

Optionally, the pixel electrode voltage variation determination unit is configured to determine the variation value of the voltage applied to the pixel electrode in accordance with the variation value of the alternating voltage at the first frequency applied to the second common electrode as well as a capacitance between a first common electrode and the pixel electrode and a capacitance between the second common electrode and the pixel electrode.

Optionally, the variation value of the voltage applied to the pixel electrode meets the following equation:

$$\Delta V_p = \frac{C2}{C1+C2} \Delta V,$$

where $\Delta V_p$ represents the variation value of the voltage applied to the pixel electrode, C1 represents the capacitance between the first common electrode and the pixel electrode, C2 represents the capacitance between the second common electrode and the pixel electrode, and $\Delta V$ represents the variation value of the alternating voltage at the first frequency.

In still yet another aspect, the present disclosure provides in some embodiments a display device including the above-mentioned display panel.

Optionally, the display device further includes the above-mentioned device for measuring screen flickering.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in some embodiments a display panel, a method and a device for measuring screen flickering, and a display device, so as to improve the screen flickering on a display panel without changing a deflection frequency of the liquid crystal molecules driven by a pixel electrode, thereby to prevent the screen flickering from being observed by human eyes easily.

The present disclosure will be described hereinafter in conjunction with the drawings and embodiments.

First Embodiment

Figure 1:
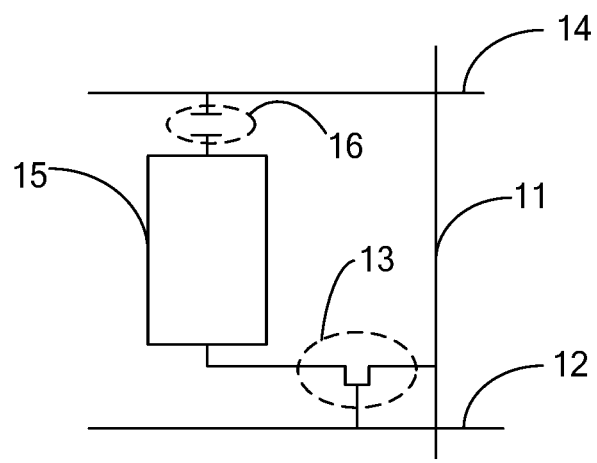
FIG. 1 is a schematic view showing a conventional subpixel unit.
Figure 2:
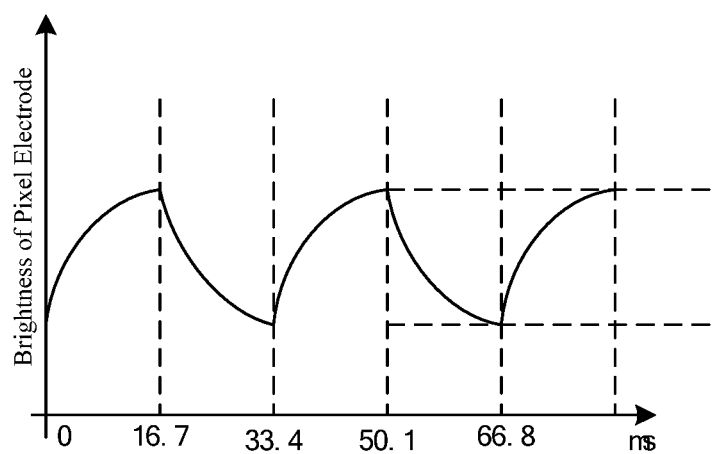
FIG. 2 is a curve diagram of brightness variation of a conventional pixel electrode.
Figure 3:
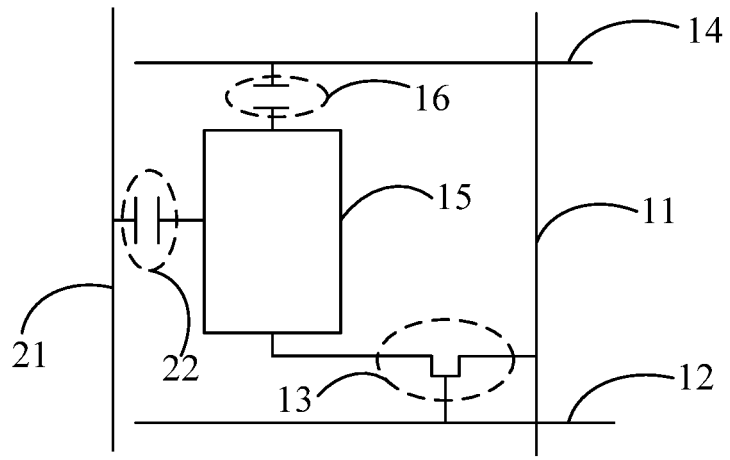
FIG. 3 is a schematic view showing a display panel according to one embodiment of the present disclosure.

Referring to FIG. 3, the present disclosure provides in this embodiment a display panel, which includes a substrate (not shown), data lines 11 and gate lines 12 arranged on the substrate and crossing each other, and subpixel units defined by the data lines and the gate lines. Each subpixel unit includes a TFT 13, a pixel electrode 15, a first common electrode 14 and a second common electrode 21. The second common electrode 21 is connected to an input end capable of providing an alternating voltage at a first frequency. An orthogonal projection of the second common electrode 21 onto the substrate at least partially overlaps an orthogonal projection of the pixel electrode 15 onto the substrate.

It should be appreciated that, the first frequency is usually greater than or equal to 120 HZ, i.e., the alternating voltage at a high frequency is applied to the second common electrode. An orthogonal projection of the second common electrode 21 onto the substrate at least partially overlaps an orthogonal projection of the pixel electrode 15 onto the substrate, so as to form a capacitor 22 between the second common electrode 21 and the pixel electrode 15. In addition, the capacitor 22 may be of a constant value, depending on characteristics of the display panel.

FIG. 3 shows two capacitors, one of which, i.e., the capacitor 16, is formed between the pixel electrode 15 and the first common electrode 14, and the other of which, i.e., the capacitor 22, is formed between the pixel electrode 15 and the second common electrode 21. Hence, the capacitors 16 and 22 are not newly-added elements, and they are shown in FIG. 3 so as to facilitate the understanding of the present disclosure.

According to the display panel in the embodiments of the present disclosure, the display panel includes the second common electrode 21, and the orthogonal projection of the second common electrode 21 onto the substrate at least partially overlaps the orthogonal projection of the pixel electrode 15 onto the substrate. Hence, the capacitor 22 may be formed between the second common electrode 21 and the pixel electrode 15. After the alternating voltage at the first frequency has been applied to the second common electrode 21, due to a charging or discharging process of the capacitor 22, the alternating voltage at the first frequency may be applied to the pixel electrode 15, so as to increase the frequency of the voltage applied to the pixel electrode 15, thereby to improve the screen flickering on the display panel and prevent the screen flickering from being observed easily by human eyes.

Optionally, each data line 11 is connected to an input end capable of providing an alternating voltage at a second frequency smaller than the first frequency. Each data line 11 is connected to the pixel electrode 15 via the TFT 13, and the voltage applied to the pixel electrode 15 varies at the first frequency.

The data line 11 is connected to the pixel electrode 15, so as to apply the alternating voltage at the second frequency to the pixel electrode 15. Meanwhile, the second common electrode 21 is connected to the pixel electrode 15, so as to apply the alternating voltage at the first frequency greater than the second frequency to the pixel electrode 15, thereby to enable the frequency of the voltage applied to the pixel electrode 15 to be identical to the first frequency, increase the frequency of the voltage applied to the pixel electrode 15 and reduce a variation value, i.e., an amplitude, of the voltage applied to the pixel electrode 15. As a result, it is able to improve the screen flickering on the display panel and prevent the screen flickering from being observed easily by human eyes.

It should be appreciated that, in the embodiments of the present disclosure, the second common electrode 21 and the first common electrode 14 may be arranged at different layers, or an identical layer. However, the orthogonal projection of the second common electrode 21 onto the substrate does not overlap an orthogonal projection of the first common electrode 14 onto the substrate (i.e., there is no intersection between the two orthogonal projections, or an overlapping portion therebetween has an area of zero), so as to prevent a capacitor from being formed between the second common electrode 21 and the first common electrode 14, thereby to prevent the voltage applied to the second common electrode 21 or the first common electrode 14 from being adversely affected. The substrate may be a base substrate of a color filter substrate or the array substrate. The substrate onto which the orthogonal projections of the second common electrode 21 and the first common electrode 14 do not overlap each other may be determined in accordance with a position relationship between the second common electrode 21 and the first common electrode 14.

The position relationships among the second common electrode 21, the first common electrode 14 and the pixel electrode 15 will be described hereinafter. The following position relationships merely relate to parts of, rather than all of, the position relationships, and any other position relationships among them also fall within the scope of the present disclosure, as long as the frequency of the voltage applied to the pixel electrode may be increased through the second common electrode.

As a first kind of the position relationship, the pixel electrode 15, the first common electrode 14 and the second common electrode 21 are arranged on the array substrate, the first common electrode 14 is arranged above the pixel electrode 15, and the second common electrode 21 is arranged below the pixel electrode 15; or the second common electrode 21 is arranged above the pixel electrode 15, and the first common electrode 14 is arranged below the pixel electrode 15; or the second common electrode 21 is arranged at a layer identical to the first common electrode 14. An orthogonal projection of the second common electrode 21 onto the base substrate of the array substrate at least partially overlaps an orthogonal projection of the pixel electrode 15 onto the base substrate of the array substrate, the orthogonal projection of the second common electrode 21 onto the base substrate of the array substrate does not overlap an orthogonal projection of the first common electrode 14 onto the base substrate of the array substrate, and the second common electrode 21 is insulated from the first common electrode 14.

As a second kind of the position relationship, the pixel electrode 15 and the second common electrode 21 are both arranged on the array substrate, the first common electrode 14 is arranged on the color filter substrate, and the second common electrode 21 is arranged above or below the pixel electrode 15. The orthogonal projection of the second common electrode 21 onto the base substrate of the array substrate at least partially overlaps the orthogonal projection of the pixel electrode 15 onto the base substrate of the array substrate, the orthogonal projection of the second common electrode 21 onto the base substrate of the array substrate does not overlap the orthogonal projection of the first common electrode 14 onto the base substrate of the array substrate, and the second common electrode 21 is insulated from the first common electrode 14.

As a third kind of the position relationship, the pixel electrode 15 is arranged on the array substrate, the second common electrode 21 and the first common electrode 14 are both arranged on the color filter substrate, and the second common electrode 21 is arranged above or below the first common electrode 14, or the second common electrode 21 is arranged at a layer identical to the first common electrode 14. The orthogonal projection of the second common electrode 21 onto the base substrate of the array substrate at least partially overlaps the orthogonal projection of the pixel electrode 15 onto the base substrate of the array substrate, an orthogonal projection of the second common electrode 21 onto the base substrate of the color filter substrate does not overlap an orthogonal projection of the first common electrode 14 onto the base substrate of the color filter substrate, and the second common electrode 21 is insulated from the first common electrode 14.

Optionally, the second common electrode 21 is made of a transparent conductive layer or a conductive metal layer.

Optionally, the second common electrode 21 is arranged within an orthogonal projection of a black matrix onto the color filter substrate or array substrate.

To be specific, the second common electrode 21 may be arranged within a region shielded by the black matrix, so as to prevent an aperture ratio of the display panel from being adversely affected.

According to the display panel in the embodiment of the present disclosure, in the case that the alternating voltage at the first frequency is applied to the second common electrode, it is able to improve the screen flickering on the display panel. The measuring method will be described in the second embodiment.

Second Embodiment

Figure 4:
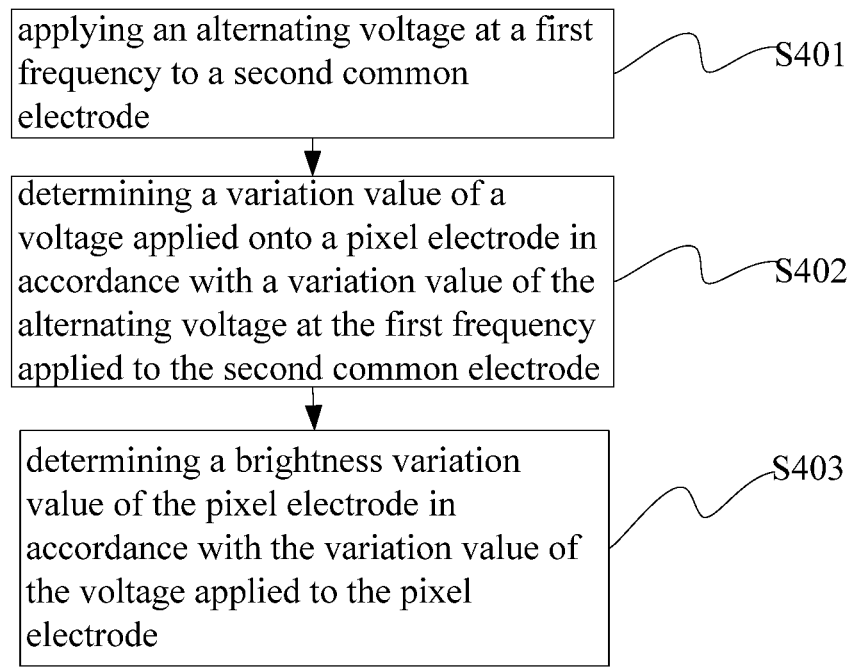
FIG. 4 is a flow chart of a method for measuring screen flickering according to one embodiment of the present disclosure.

As shown in FIG. 4, the present disclosure provides in this embodiment a method for measuring screen flickering on the display panel, which includes the following steps.

Step S401: applying the alternating voltage at the first frequency to the second common electrode. It should be appreciated that, the alternating voltage at the first frequency applied to the second common electrode is larger than the alternating voltage at the second frequency applied to the data line.

Step S402: determining a variation value of the voltage applied onto the pixel electrode in accordance with a variation value of the alternating voltage at the first frequency applied to the second common electrode. It should be appreciated that, the variation value of the alternating voltage at the first frequency refers to a voltage difference between the alternating voltages before and after the variation, and the variation value of the voltage applied to the pixel electrode refers to a maximum voltage difference between the voltages before and after the variation, i.e., an amplitude.

For example, at t0, an voltage of 1V is applied to the pixel electrode, and a voltage of 1V is applied to the second common electrode. At t1, the alternating voltage at the first frequency is jumped from 1V to 3V, so a variation value of the alternating voltage at the first frequency is 2V (i.e., 3V−1V). At this time, the voltage applied to the pixel electrode is still 1V, but the voltage applied to the second common electrode is changed to 3V, so a voltage difference exists between the second common electrode and the pixel electrode. The capacitor formed between the second common electrode and the pixel electrode may be charged due to the voltage difference, so as to increase the voltage applied to the pixel electrode. The variation value of the voltage applied to the pixel electrode depends on the variation value of the alternating voltage at the first frequency applied to the second common electrode, and it will be described hereinafter.

The step of determining the variation value of the voltage applied to the pixel electrode in accordance with the variation value of the alternating voltage at the first frequency applied to the second common electrode includes determining the variation value of the voltage applied to the pixel electrode in accordance with the variation value of the alternating voltage at the first frequency applied to the second common electrode as well as a capacitance between a first common electrode and the pixel electrode and a capacitance between the second common electrode and the pixel electrode.

To be specific, for each display panel, the capacitance between the first common electrode and the pixel electrode and the capacitance between the second common electrode and the pixel electrode are both constant, so the variation value of the voltage applied to the pixel electrode merely depends on the variation value of the alternating voltage at the first frequency applied to the second common electrode.

The variation value of the voltage applied to the pixel electrode meets the following equation:

$$\Delta V_p = \frac{C2}{C1 + C2} \Delta V,$$

where $\Delta V_p$ represents the variation value of the voltage applied to the pixel electrode, C1 represents the capacitance between the first common electrode and the pixel electrode, C2 represents the capacitance between the second common electrode and the pixel electrode, and $\Delta V$ represents the variation value of the alternating voltage at the first frequency.

For each display panel, C1 and C2 are each of a constant value, and C1 may be equal to, or not equal to, C2.

Step S403: determining a brightness variation value of the pixel electrode in accordance with the variation value of the voltage applied to the pixel electrode.

After the variation value of the voltage applied to the pixel electrode has been determined, it is able to determine the brightness variation value of the pixel electrode in a known method, which is not particularly defined herein.

The effects of the above-mentioned method will be described hereinafter in conjunction with the embodiments.

Figure 5:
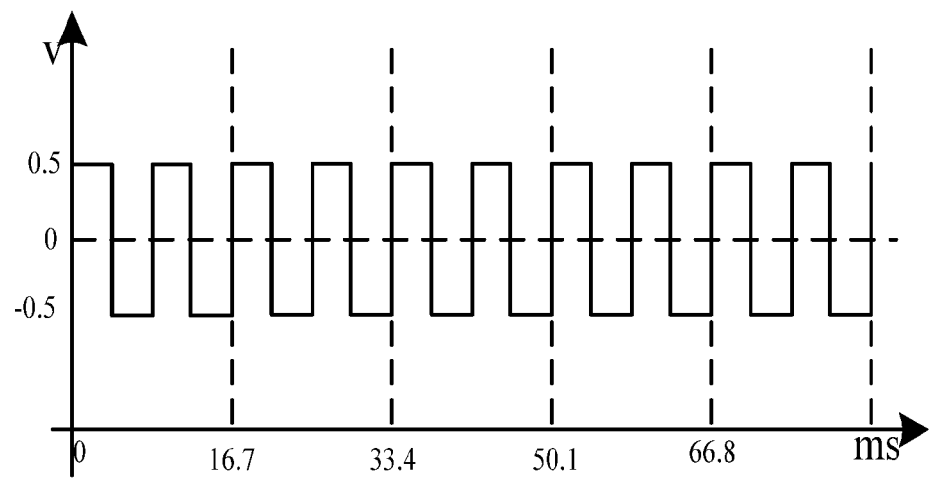
FIG. 5 is an oscillogram of an alternating voltage signal at a first frequency according to one embodiment of the present disclosure.

For example, after the manufacture of the display panel, the capacitance C1 between the first common electrode and the pixel electrode has a value of A, the capacitance C2 between the second common electrode and the pixel electrode has a value of B, and the alternating voltage signal at the first frequency has a frequency of 240 Hz and an amplitude of −0.5V to 0.5V. FIG. 5 is an oscillogram of the alternating voltage signal at the first frequency.

After the alternating voltage at the first frequency in FIG. 5 is applied to the second common electrode, the voltage applied to the second common electrode may be varied at a frequency of 240 Hz, and its amplitude is −0.5V to 0.5V. Due to the charging process of the capacitor C2, the voltage applied to the pixel electrode may be varied at a frequency of 240 Hz. Based on the above equation, the variation value of the voltage applied to the pixel electrode is $$\Delta V_p = \frac{B}{A+B} \times 1,$$

i.e., it is smaller than 1V. Several experiments show that, a maximum voltage applied to the pixel electrode is 1.8V, and a minimum voltage applied to the pixel electrode is 1.5 C, i.e., the variation value of voltage applied to the pixel electrode is 0.3V. Then, the brightness variation value of the pixel electrode may be determined in accordance with the variation value of the voltage applied to the pixel electrode using the known method.

Figure 6:
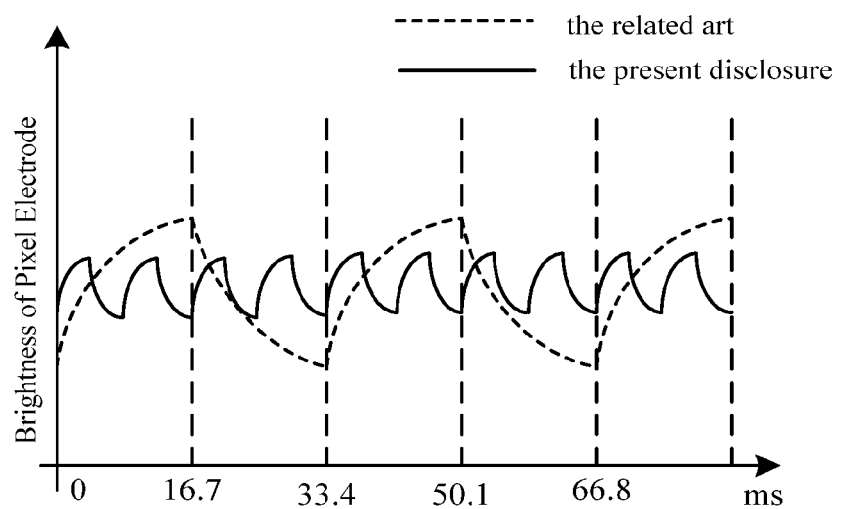
FIG. 6 is a curve diagram of brightness variation of a pixel electrode according to one embodiment of the present disclosure.

FIG. 6 is a curve diagram showing the brightness variation of the pixel electrode. As shown in FIG. 6, the brightness of the pixel electrode in the embodiments of the present disclosure is varied at a frequency greater than that in the related art, and the brightness variation value of the pixel electrode in the embodiments of the present disclosure is smaller than that in the related art.

Figure 7:
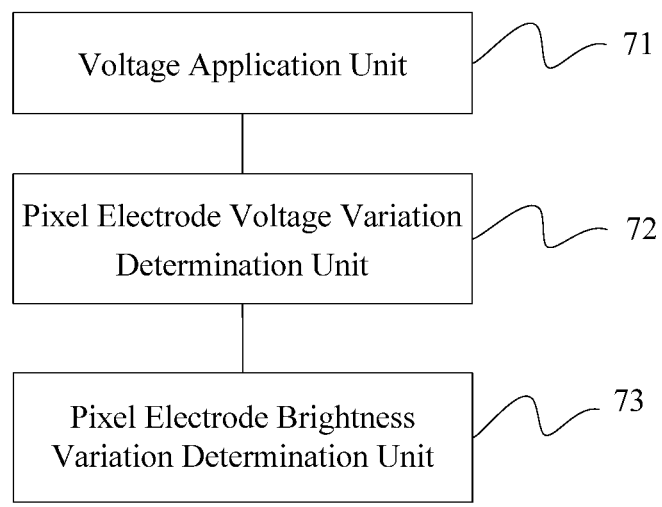
FIG. 7 is a schematic view showing a device for measuring screen flickering according to one embodiment of the present disclosure.

Referring to FIG. 7, the present disclosure further provides in some embodiments a device for measuring screen flickering, which includes: a voltage application unit 71 configured to apply the alternating voltage at the first frequency to the second common electrode; a pixel electrode voltage variation determination unit 72 configured to determine the variation value of the voltage applied onto the pixel electrode in accordance with the variation value of the alternating voltage at the first frequency applied to the second common electrode; and a pixel electrode brightness variation determination unit 73 configured to determine the brightness variation value of the pixel electrode in accordance with the variation value of the voltage applied to the pixel electrode.

According to the device in the embodiments of the present disclosure, in the case that the alternating voltage at the first frequency is applied to the second common electrode, the voltage applied to the pixel electrode may be varied at the first frequency due to a capacitor formed between the second common electrode and the pixel electrode, so as to increase a variation frequency of the voltage applied to the pixel electrode. In addition, the variation value of the voltage applied to the pixel electrode may be reduced, so as to reduce the brightness variation value of the pixel electrode.

As a result, it is able to improve the screen flickering on the display panel, thereby to prevent the flicking image from being observed easily by human eyes.

The pixel electrode voltage variation determination unit 72 is configured to determine the variation value of the voltage applied to the pixel electrode in accordance with the variation value of the alternating voltage at the first frequency applied to the second common electrode as well as the capacitance between a first common electrode and the pixel electrode and the capacitance between the second common electrode and the pixel electrode.

The variation value of the voltage applied to the pixel electrode meets the following equation:

$$\Delta V_p = \frac{C2}{C1+C2} \Delta V,$$

where $\Delta V_p$ represents the variation value of the voltage applied to the pixel electrode, C1 represents the capacitance between the first common electrode and the pixel electrode, C2 represents the capacitance between the second common electrode and the pixel electrode, and $\Delta V$ represents the variation value of the alternating voltage at the first frequency.

The present disclosure further provides in some embodiments a display device including the above-mentioned display panel and the above-mentioned device for measuring screen flickering.

According to the display panel, the method and device for measuring screen flickering and the display device in the embodiments of the present disclosure, the display panel includes the second common electrode, and the orthogonal projection of the second common electrode onto the substrate at least partially overlaps the orthogonal projection of the pixel electrode onto the substrate. A capacitor may be formed between the second common electrode and the pixel electrode. After the alternating voltage at a first frequency has been applied to the second common electrode, due to a charging or discharging process of the capacitor, the alternating voltage at the first frequency may be applied to the pixel electrode, so as to increase the frequency of the voltage applied to the pixel electrode, thereby to improve the screen flickering on the display panel and prevent the screen flickering from being observed easily by human eyes.

The above are merely the preferred embodiments of the present disclosure. Obviously, a person skilled in the art may make further modifications and improvements without departing from the spirit of the present disclosure, and these modifications and improvements shall also fall within the scope of the present disclosure.

What is claimed is:

1. A display panel, comprising a substrate, data lines and gate lines arranged on the substrate and crossing each other, and subpixel units defined by the data lines and the gate lines, wherein
each subpixel unit comprises a thin film transistor (TFT), a pixel electrode, a first common electrode and a second common electrode;
the second common electrode is connected to an input end capable of providing an alternating voltage at a first frequency; and
an orthogonal projection of the second common electrode onto the substrate at least partially overlaps an orthogonal projection of the pixel electrode onto the substrate,
wherein each data line is connected to an input end capable of providing an alternating voltage at a second frequency smaller than the first frequency, and each data line is further connected to the pixel electrode, and a voltage applied to the pixel electrode varies at the first frequency.

2. The display panel according to claim 1, wherein the pixel electrode, the first common electrode and the second common electrode are arranged on the array substrate, the first common electrode is arranged above the pixel electrode, and the second common electrode is arranged below the pixel electrode; or the second common electrode is arranged above the pixel electrode, and the first common electrode is arranged below the pixel electrode; or the second common electrode is arranged at a layer identical to the first common electrode.

3. The display panel according to claim 1, wherein the pixel electrode and the second common electrode are both arranged on the array substrate, the first common electrode is arranged on a color filter substrate, and the second common electrode is arranged above or below the pixel electrode.

4. The display panel according to claim 1, wherein the pixel electrode is arranged on the array substrate, the second common electrode and the first common electrode are both arranged on a color filter substrate, and the second common electrode is arranged above or below the first common electrode, or the second common electrode is arranged at a layer identical to the first common electrode.

5. The display panel according to claim 1, wherein an orthogonal projection of the second common electrode onto a base substrate of the array substrate at least partially overlaps an orthogonal projection of the pixel electrode onto the base substrate of the array substrate; and
an orthogonal projection of the second common electrode onto the base substrate of the array substrate or a base substrate of a color filter substrate does not overlap an orthogonal projection of the first common electrode onto the base substrate of the array substrate or the color filter substrate, and the second common electrode is insulated from the first common electrode.

6. The display panel according to claim 1, wherein the second common electrode is made of a transparent conductive layer or a conductive metal layer.

7. The display panel according to claim 1, wherein the second common electrode is arranged within an orthogonal projection of a black matrix onto a color filter substrate or array substrate.

8. A method for measuring screen flickering on a display panel wherein the display panel comprises a substrate, data lines and gate lines arranged on the substrate and crossing each other, and subpixel units defined by the data lines and the gate lines, wherein each subpixel unit comprises a thin film transistor (TFT), a pixel electrode, a first common electrode and a second common electrode; the second common electrode is connected to an input end capable of providing an alternating voltage at a first frequency; and an orthogonal projection of the second common electrode onto the substrate at least partially overlaps an orthogonal projection of the pixel electrode onto the substrate,
the method comprises steps of:
applying an alternating voltage at a first frequency to a second common electrode;
determining a variation value of a voltage applied onto a pixel electrode in accordance with a variation value of the alternating voltage at the first frequency applied to the second common electrode; and determining a brightness variation value of the pixel electrode in accordance with the variation value of the voltage applied to the pixel electrode.

9. The method according to claim 8, wherein the step of determining the variation value of the voltage applied to the pixel electrode in accordance with the variation value of the alternating voltage at the first frequency applied to the second common electrode comprises:

determining the variation value of the voltage applied to the pixel electrode in accordance with the variation value of the alternating voltage at the first frequency applied to the second common electrode as well as a capacitance between a first common electrode and the pixel electrode and a capacitance between the second common electrode and the pixel electrode.

10. The method according to claim 9, wherein the variation value of the voltage applied to the pixel electrode meets the following equation:

$$\Delta V_p = \frac{C2}{C1+C2} \Delta V,$$

wherein $\Delta V_p$ represents the variation value of the voltage applied to the pixel electrode, C1 represents the capacitance between the first common electrode and the pixel electrode, C2 represents the capacitance between the second common electrode and the pixel electrode, and $\Delta V$ represents the variation value of the alternating voltage at the first frequency.

11. A display device comprising a display panel, the display panel comprising a substrate, data lines and gate lines arranged on the substrate and crossing each other, and subpixel units defined by the data lines and the gate lines, wherein each subpixel unit comprises a thin film transistor (TFT), a pixel electrode, a first common electrode and a second common electrode;

the second common electrode is connected to an input end capable of providing an alternating voltage at a first frequency; and an orthogonal projection of the second common electrode onto the substrate at least partially overlaps an orthogonal projection of the pixel electrode onto the substrate, wherein each data line is connected to an input end capable of providing an alternating voltage at a second frequency smaller than the first frequency, and each data line is further connected to the pixel electrode, and a voltage applied to the pixel electrode varies at the first frequency.

12. The display device according to claim 11, further comprising a device for measuring screen flickering on the display panel, wherein the device for measuring screen flickering on the display panel comprises:

a voltage application unit configured to apply an alternating voltage at a first frequency to a second common electrode;

a pixel electrode voltage variation determination unit configured to determine a variation value of a voltage applied onto a pixel electrode in accordance with a variation value of the alternating voltage at the first frequency applied to the second common electrode; and a pixel electrode brightness variation determination unit configured to determine a brightness variation value of the pixel electrode in accordance with the variation value of the voltage applied to the pixel electrode.

13. The display device according to claim 11, wherein the pixel electrode, the first common electrode and the second common electrode are arranged on the array substrate, the first common electrode is arranged above the pixel electrode, and the second common electrode is arranged below the pixel electrode; or the second common electrode is arranged above the pixel electrode, and the first common electrode is arranged below the pixel electrode; or the second common electrode is arranged at a layer identical to the first common electrode.

14. The display device according to claim 11, wherein the pixel electrode and the second common electrode are both arranged on the array substrate, the first common electrode is arranged on a color filter substrate, and the second common electrode is arranged above or below the pixel electrode.

15. The display device according to claim 11, wherein the pixel electrode is arranged on the array substrate, the second common electrode and the first common electrode are both arranged on a color filter substrate, and the second common electrode is arranged above or below the first common electrode, or the second common electrode is arranged at a layer identical to the first common electrode.

* * * * *